United States Patent
Zhang (12) United States Patent (10) Patent No.: US 9,147,779 B2
(45) Date of Patent: Sep. 29, 2015

(54) SOLAR CELL BY-PASS DIODE WITH IMPROVED METAL CONTACTS

(71) Applicant: THE BOEING COMPANY, Chicago, IL (US)

(72) Inventor: Xiaobo Zhang, Sylmar, CA (US)

(73) Assignee: THE BOEING COMPANY, Chicago, IL (US)

( * ) Notice: Subject to any disclaimer, the term of this patent is extended or adjusted under 35 U.S.C. 154(b) by 50 days.

(21) Appl. No.: 13/874,981

(22) Filed: May 1, 2013

(65) Prior Publication Data

US 2014/0326304 A1 Nov. 6, 2014

(51) Int. Cl.
*H01L 31/0224* (2006.01)
*H01L 29/40* (2006.01)
*H01L 29/66* (2006.01)
*H01L 29/861* (2006.01)
*H01L 31/02* (2006.01)
*H01L 31/044* (2014.01)
*H01L 29/45* (2006.01)

(52) U.S. Cl.
CPC ...... *H01L 31/022441* (2013.01); *H01L 29/401* (2013.01); *H01L 29/66128* (2013.01); *H01L 29/8611* (2013.01); *H01L 31/02021* (2013.01); *H01L 31/044* (2014.12); *H01L 29/456* (2013.01); *Y02E 10/50* (2013.01)

(58) Field of Classification Search
CPC ................. H01L 31/02021; H01L 31/022441; H01L 31/044
USPC ...................... 136/256, 261, 255, 252; 438/98
See application file for complete search history.

(56) References Cited

U.S. PATENT DOCUMENTS

| | | | | |
|---|---|---|---|---|
| 3,903,427 A | * | 9/1975 | Pack | 250/208.2 |
| 4,690,730 A | | 9/1987 | Tang et al. | |
| 4,838,952 A | * | 6/1989 | Dill et al. | 136/256 |
| 5,259,891 A | * | 11/1993 | Matsuyama et al. | 136/244 |
| 5,421,908 A | * | 6/1995 | Yoshida et al. | 136/244 |
| 5,468,988 A | * | 11/1995 | Glatfelter et al. | 257/431 |
| 6,384,317 B1 | * | 5/2002 | Kerschaver et al. | 136/256 |
| 6,730,594 B2 | * | 5/2004 | Noguchi et al. | 438/653 |
| 8,669,466 B2 | * | 3/2014 | Guha et al. | 136/256 |

(Continued)

FOREIGN PATENT DOCUMENTS

| | | |
|---|---|---|
| EP | 0211174 A2 | 2/1987 |
| JP | S58213469 A | 12/1983 |
| JP | 2005020021 A | 1/2005 |

OTHER PUBLICATIONS

Sickafus, et al., "Interlayer Oxidation Via Pores in Multilayer Metallic Films: Ag/Pd/Ti/(111) Si", Thin Solid Films, 78 (1981), pp. 49-65.

(Continued)

*Primary Examiner* — Golam Mowla
(74) *Attorney, Agent, or Firm* — Vista IP Law Group LLP; Cynthia A. Dixon (57) ABSTRACT

The present disclosure provides a system, method, and apparatus for a solar cell by-pass diode with improved metal contacts. The method involves depositing a dielectric layer (e.g., SiO2 layer) on the metal contacts, and etching off a portion of the dielectric layer after sintering the metal contacts. The dielectric layer prevents the contact metal from oxidation during sintering. The unetched portion of the dielectric layer is used as the P-N junction passivation by the by-pass diode.

16 Claims, 6 Drawing Sheets

(56) References Cited

U.S. PATENT DOCUMENTS

| | | | |
|---|---|---|---|
| 2005/0176164 A1* | 8/2005 | Gee et al. | 438/48 |
| 2006/0060238 A1* | 3/2006 | Hacke et al. | 136/256 |
| 2006/0214184 A1 | 9/2006 | Wang et al. | |
| 2007/0235075 A1* | 10/2007 | Park | 136/252 |
| 2008/0099871 A1* | 5/2008 | Bui et al. | 257/461 |
| 2009/0314346 A1* | 12/2009 | Hishida | 136/258 |

OTHER PUBLICATIONS

Zhu, et al., "Low-resistance Titanium/n-type Silicon (1 0 0) Contacts by Monolayer Selenium Passivation", Institute of Physics Publishing, J. Phys. D: Appl. Phys. 40 (2007), pp. 547-550.

Extended European Search Report, Application No. 14158253.6-1552, Sep. 8, 2014.

* cited by examiner

SOLAR CELL BY-PASS DIODE WITH IMPROVED METAL CONTACTS

FIELD

The present disclosure relates to by-pass diodes. In particular, it relates to solar cell by-pass diodes with improved metal contacts.

BACKGROUND

Titanium is typically used for the ohmic contacts of silicon diodes by forming titanium silicide. However, oxygen in the environment oxidizes titanium during the metal contact sinter process, which is typically run in a temperature range from 300 degrees Celsius to 600 degrees Celsius. The oxidized titanium layer weakens metal contact adhesion to silicon and, as such, the reliability of the diodes is compromised.

Therefore, a solar cell by-pass diode with improved metal contacts is needed.

SUMMARY

The present disclosure relates to a method, system, and apparatus for a solar cell by-pass diode with improved metal contacts. The disclosed method for manufacturing a solar cell by-pass diode involves forming a first doping layer, by diffusion or ion implant, on a first side of a silicon wafer. The method further involves depositing by chemical vapor deposition (CVD) a first dielectric layer (e.g., a $SiO_2$ layer) on the first doping layer and on a second side of the silicon wafer. Also, the method involves etching an opening in the first dielectric layer on the second side of the silicon wafer. In addition, the method involves performing diffusion or ion implant over the opening to create a junction. Additionally, the method involves removing the first dielectric layer from the first doping layer and from the second side of the silicon wafer. Also, the method involves depositing a first metal contact on the junction, and depositing a second metal contact on the first doping layer. In addition, the method involves depositing by CVD a second dielectric layer (e.g., a $SiO_2$ layer) on the first metal contact, on an exposed portion of the second side of the silicon wafer, and on the second metal contact. Further, the method involves etching an opening in the second dielectric layer on the first metal contact.

In one or more embodiments, the method further involves, after forming the first doping layer on the first side of a silicon wafer, depositing by CVD an initial dielectric layer (e.g., a $SiO_2$ layer) on the first doping layer and on the second side of the silicon wafer. In at least one embodiment, the method further involves performing thermal annealing. In some embodiments, the method further involves removing the initial dielectric layer from the first doping layer and from the second side of the silicon wafer.

In at least one embodiment, the removing of the initial dielectric layer from the first doping layer and from the second side of the silicon wafer is performed by using hydrofluoric acid. In some embodiments, the method further involves, prior to etching the opening in the second dielectric layer on the first metal contact, sintering the first metal contact and the second metal contact.

In one or more embodiments, the first doping layer is a p-type material. In at least one embodiment, the p-type material of the first doping layer is boron (B).

In some embodiments, the first metal contact is a titanium, palladium, and silver (Ti/Pd/Ag) alloy; or is an aluminum, titanium, palladium, and silver (Al/Ti/Pd/Ag) alloy. In one or more embodiments, the second metal contact is a titanium, palladium, and silver (Ti/Pd/Ag) alloy; or is an aluminum, titanium, palladium, and silver (Al/Ti/Pd/Ag) alloy.

In at least one embodiment, the first dielectric layer is silicon dioxide ($SiO_2$). In one or more embodiments, the second dielectric layer is silicon dioxide ($SiO_2$). In some embodiments, the initial dielectric layer is silicon dioxide ($SiO_2$).

In at least one embodiment, the first doping layer is an n-type material. In some embodiments, the n-type material of the first doping layer is phosphorous (P).

In one or more embodiments, the etching of the opening in the first dielectric layer on the second side of the silicon wafer is performed by using at least one of photolithography and hydrofluoric acid. In at least one embodiment, the removing of the first dielectric layer from the first doping layer and from the second side of the silicon wafer is performed by using hydrofluoric acid. In some embodiments, the depositing of the first metal contact on the junction and the depositing of the second metal contact on the first doping layer are performed by using electron-beam (e-beam) evaporation.

In at least one embodiment, a method for manufacturing a solar cell by-pass diode is disclosed. The disclosed method involves depositing a first dielectric layer on a first side of a silicon wafer. The method further involves etching a first opening in the first dielectric layer. Also, the method involves forming a first doping layer, by performing diffusion or ion implant, over the first opening to create a junction. In addition, the method involves depositing a second dielectric layer over the first doping layer and exposed silicon area of the first side. Also, the method involves etching a second opening in the second dielectric layer, where the second opening is at a different location than the first opening. In addition, the method involves forming a second doping layer, by diffusion or ion implant, over the second opening. Additionally, the method involves removing the second dielectric layer on top of the first doping layer. In addition, the method involves depositing a metal contact on the first doping layer forming a first metal contact, and depositing a metal contact on the second doping layer forming a second metal contact. Additionally, the method involves depositing a third dielectric layer on the first metal contact and on the second metal contact. Further, the method involves etching two openings in the third dielectric layer over the first metal contact and over the second metal contact.

In one or more embodiments, the method further involves, prior to etching the opening in the third dielectric layer on top of the first metal contact and the second metal contact, sintering the two metal contacts.

In at least one embodiment, the first doping layer is a p-type material, and the second doping layer is an n-type material. In one or more embodiments, the p-type material of the first doping layer is boron (B), and the n-type material of the second doping layer is phosphorus (P).

In one or more embodiments, the first doping layer is an n-type material, and the second doping layer is a p-type material. In some embodiments, the first metal contact is a titanium, palladium, and silver (Al/Ti/Pd/Ag) alloy or an aluminum, titanium, palladium, and silver (Al/Ti/Pd/Ag) alloy. In one or more embodiments, the second metal contact is a titanium, palladium, and silver (Al/Ti/Pd/Ag) alloy or an aluminum, titanium, palladium, and silver (Al/Ti/Pd/Ag) alloy.

In at least one embodiment, the first dielectric layer and/or the second dielectric layer and/or the third dielectric layer is silicon dioxide ($SiO_2$). In some embodiments, the etching of the opening in the first dielectric layer, in the second dielectric layer, and/or in the third dielectric layer on the silicon wafer is performed by using photolithography and/or hydrofluoric acid. In one or more embodiments, the depositing of the first metal contact on the junction, and the depositing of the second metal contact on the second doping layer are performed by using electron-beam evaporation.

In at least one embodiment, a solar cell by-pass diode comprises a silicon wafer, and a type 2 doping layer formed on a first side of the silicon wafer. The solar cell by-pass diode further comprises a type 1 doping layer diffused or implanted into a portion of a second side of the silicon wafer. Also, the solar cell by-pass diode comprises a front metal contact deposited on the type 1 doping layer. In addition, the solar cell by-pass diode comprises a back metal contact deposited on the type 2 doping layer. Further, the solar cell by-pass diode comprises a dielectric layer deposited on the front metal contact and an exposed portion of the second side of the silicon wafer, where the dielectric layer has an opening exposing the front metal contact.

In one or more embodiments, the type 2 doping layer is an n-type material. In some embodiments, the type 2 doping layer is a p-type material.

In at least one embodiment, a solar cell by-pass diode comprises a silicon wafer. The diode further comprises a type 1 doping layer formed on a first portion of a first side of the silicon wafer, and a type 2 doping layer formed on a second portion of the first side of the silicon wafer. In addition, the diode comprises a type 1 metal contact deposited on the type 1 doping layer, and a type 2 metal contact deposited on the type 2 doping layer. Additionally, the diode comprises a dielectric layer deposited on the type 1 metal contact and the type 2 metal contact, and on an exposed portion of the silicon wafer, where the dielectric layer has two openings exposing the type 1 metal contact and the type 2 metal contact.

In one or more embodiments, the type 2 doping layer is an n-type material, and the type 1 doping layer is a p-type material. In some embodiments, the type 2 doping layer is a p-type material, and the type 1 doping layer is an n-type material.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein provide an operative system for a solar cell by-pass diode with improved metal contacts. Specifically, the system improves solar cell by-pass diode metal contact adhesion by employing a dielectric film on top of the metal contact during the metal contact sintering process. The dielectric film prevents the contact metal from becoming oxidized during the sintering, and also prevents a short circuit in the diode and the solar cell assembly.

As previously mentioned above, titanium (Ti) is typically used for the ohmic contacts of silicon (Si) diodes by forming titanium silicide ($TiSi_2$). But, oxygen ($O_2$) in the environment oxidizes the titanium during the metal contact sinter process. The oxidized titanium layer weakens metal contact adhesion to silicon and, thus, such diodes cannot be used for space applications.

Currently, in industry, to prevent titanium oxidation of the metal contacts during the metal sinter process, the metal sinter process is performed in a furnace tube with inert gasses, such as nitrogen ($N_2$) or $N_2$ with a low content of hydrogen ($H_2$), purged into the furnace tube. However, even with employing the above-mentioned metal sinter process, oxygen in the air can diffuse into the furnace tube through its open exhaust and react with the titanium. The extent of titanium oxidation depends upon the location of the wafer in the furnace during the sintering process. Wafers located close to the exhaust of the furnace tube oxidize more than wafers located further away from the exhaust. Other than using a sinter process in a controlled environment, such as in a furnace tube, a variety of different types of contact stacks have been investigated for oxygen resilience, such as employing a palladium metal on top of the titanium to serve as an oxygen barrier. However, even with using any of these conventional solutions, metal oxidation still exists to an extent that detrimentally affects the yielded product.

The system of the present disclosure employs a dielectric layer, such as a chemical vapor deposition (CVD) silicon dioxide ($SiO_2$) layer, to cover the metal contacts of the diode during the metal sintering process, thereby preventing the titanium layer of the metal contacts from becoming oxidized. The atomic percentage of oxygen in the metal contacts of diodes with $SiO_2$ protection, detected with energy-dispersive x-ray spectroscopy (EDX), is one tenth of that in the metal contacts of diodes without $SiO_2$ protection.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
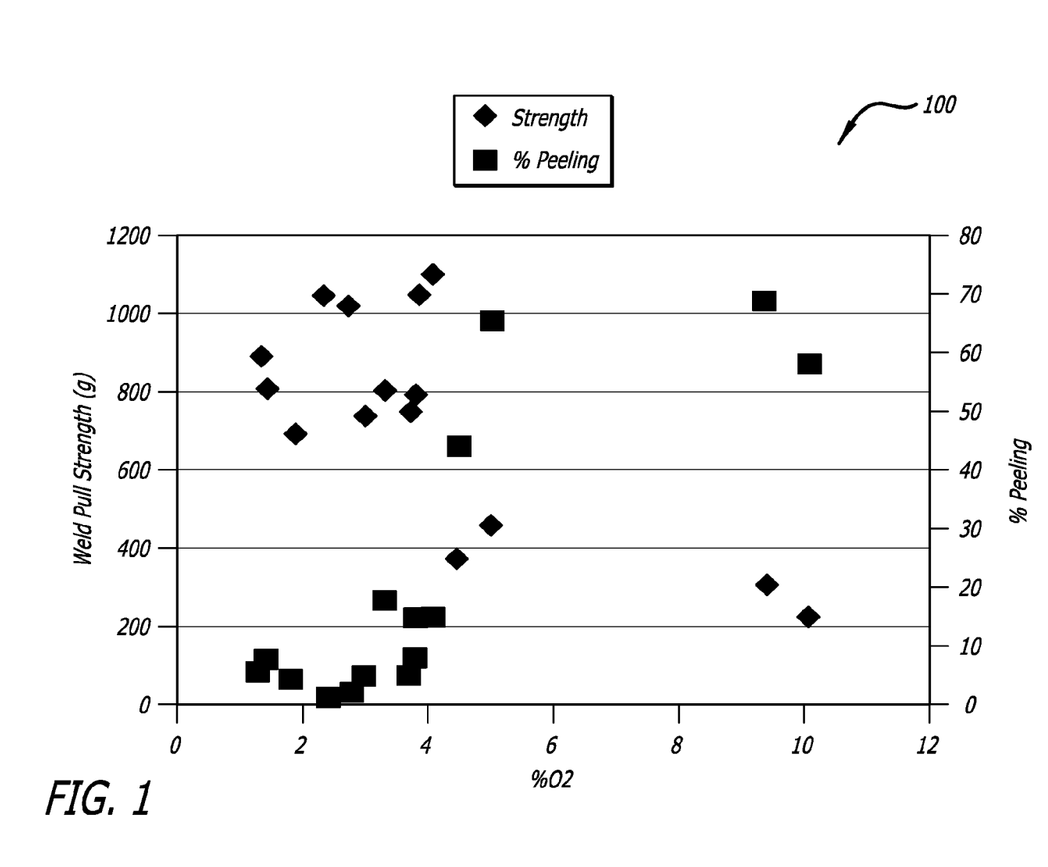
FIG. 1 is a graph showing the diode metal contact weld-pull strength and percentage peeling versus (vs.) the oxygen level in the metal contact of an existing diode.

FIG. 1 is a graph 100 showing the diode metal contact weld-pull strength and percentage peeling versus (vs.) the oxygen level in the metal contact of an existing diode. In this figure, silicon diode metal contact adhesion, of a contact manufactured from a titanium, palladium, and silver (Ti/Pd/Ag) alloy, versus the oxygen content detected by energy-dispersive x-ray spectroscopy (EDX) is demonstrated through a weld pull test. As is shown in this figure, as the oxygen (O$_2$) content increases, the weld pull strength in grams (g) decreases and the percentage of peeling on the weld footprint increases.

The diode of the present disclosure employs a dielectric film to cover the metal contacts during the sinter process. The dielectric film cover causes the metal contacts to have little exposure to oxygen, which oxidizes the titanium in the contacts. Since the dielectric film cover causes the metal contacts to have little exposure to oxygen, the metal contacts exhibit less oxidation and, thus, the metal contact adhesion is improved.

Figure 2A:
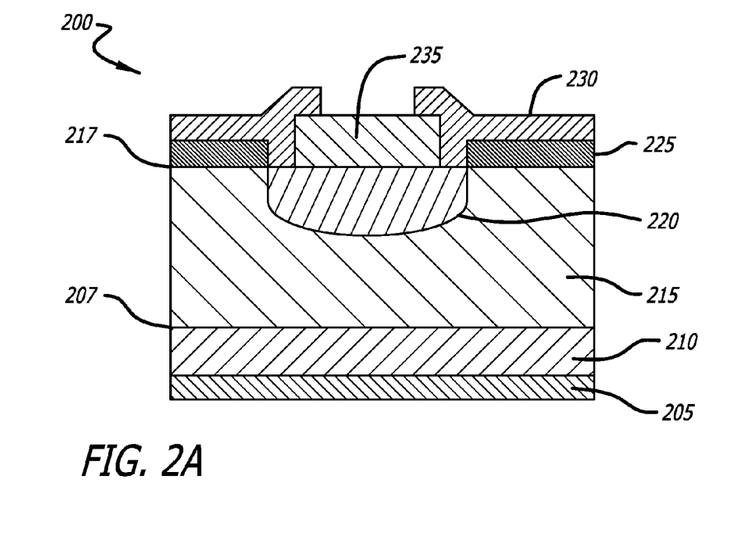
FIG. 2A is a cross-sectional view of an existing diode structure.

FIG. 2A is a cross-sectional view of an existing diode structure 200. In this figure, a type 2 doping layer 210 is shown to be formed, by diffusion or ion implant, on a first side 207 of a silicon wafer 215. In addition, a type 1 doping layer 220 is shown to be diffused (or implanted) into a portion of a second side 217 of the silicon wafer 215.

Also in this figure, a dielectric layer 225 is shown to be in two areas on top of the second side 217 of the silicon wafer 215. A front metal contact 235 is shown to be deposited on the type 1 doping layer 220, and a back metal contact 205 is shown to be deposited on the type 2 doping layer 210. In addition, a passivation layer 230 is shown to be on top of the dielectric layer 225 areas.

For this existing diode structure 200, the front metal contact 235 is sintered before being passivated. The passivation layer 230 is for preventing a short circuit in the diode 200 and the solar cell assembly (not shown).

Figure 2B:
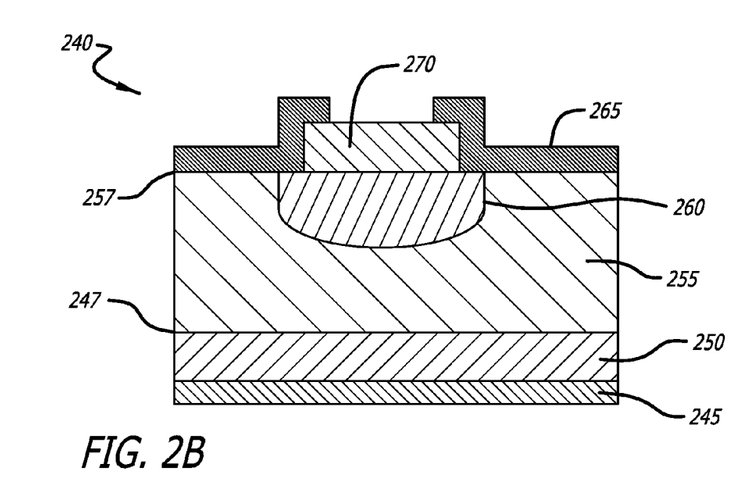
FIG. 2B is a cross-sectional view of the diode structure for the disclosed diode with improved metal contacts, in accordance with at least one embodiment of the present disclosure.

FIG. 2B is a cross-sectional view of the diode structure 240 for the disclosed diode with improved metal contacts, in accordance with at least one embodiment of the present disclosure. In this figure, a type 2 doping layer 250 is shown to be formed, by diffusion or by ion implant, on a first side 247 of a silicon wafer 255. In addition, a type 1 doping layer 260 is shown to be diffused or ion implanted into a portion of a second side 257 of the silicon wafer 255.

Also in this figure, a front metal contact 270 is shown to be deposited on the type 1 doping layer 260, and a back metal contact 245 is shown to be deposited on the type 2 doping layer 250. In addition, a dielectric layer 265 (e.g., SiO$_2$ material) is shown to be in two areas on top of the second side 257 of the silicon wafer 255.

For this disclosed diode structure 240, the front metal contact 270 is covered with a dielectric film 265 before it is sintered so that the metal layers in the front metal contact 270 are isolated from oxygen in the environment. The dielectric layer 265 is partially removed in the end of the process to expose the front metal contact 270.

It should be noted that in one or more embodiments, the type 2 doping layer 250 is an n-type material (e.g., phosphorous (P)), the silicon wafer 255 is an n-type material, and type 1 doping layer 260 is a p-type material (e.g., boron (B)). In other embodiments, the type 2 doping layer 250 is a p-type material (e.g., boron (B)), the silicon wafer 255 is a p-type material, and type 1 doping layer 260 is an n-type material (e.g., phosphorous (P)).

Figure 2C:
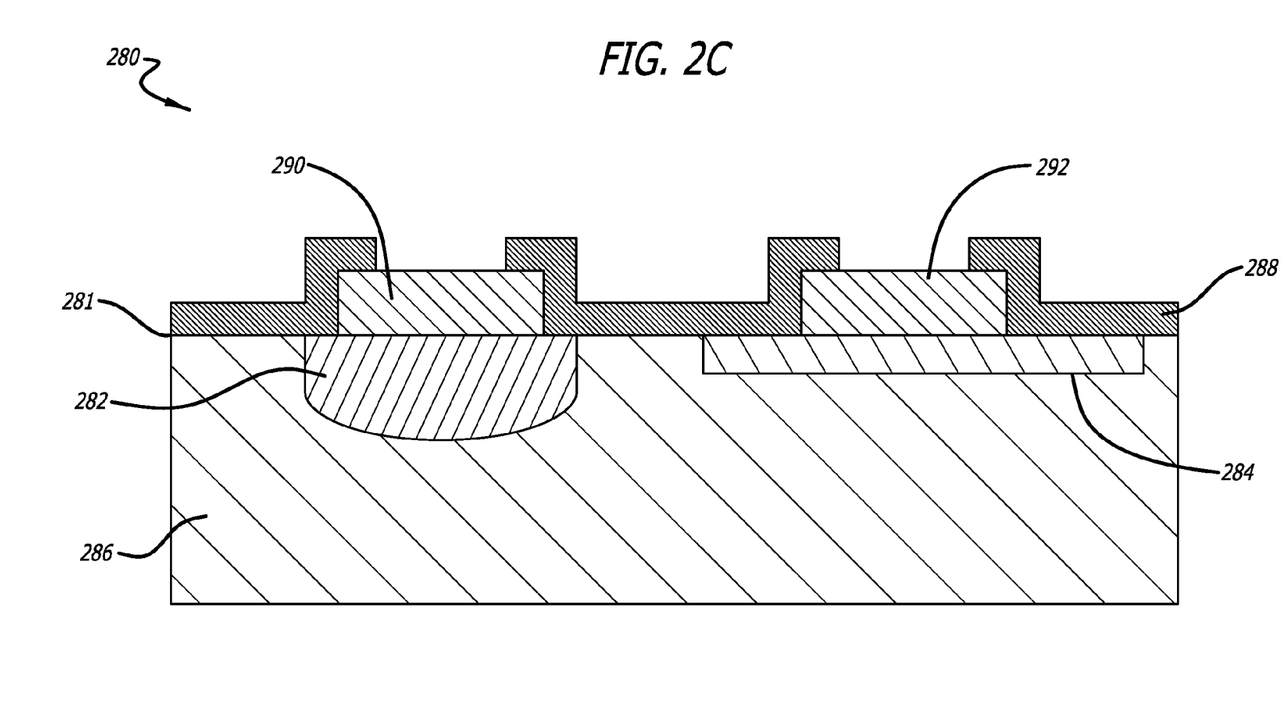
FIG. 2C is a cross-sectional view of another diode structure for the disclosed diode with improved metal contacts, in accordance with at least one embodiment of the present disclosure.

FIG. 2C is a cross-sectional view of another diode structure 280 for the disclosed diode with improved metal contacts, in accordance with at least one embodiment of the present disclosure. In this figure, a type 1 doping layer 282 is shown to be formed, by diffusion or by ion implant, on a first portion of a first side 281 of a silicon wafer 286. In addition, a type 2 doping layer 284 is shown to be formed, by diffusion or ion implant, on a second portion of the first side 281 of the silicon wafer 286.

Also in this figure, a first metal contact 290 is shown to be deposited on the type 1 doping layer 282, and a second metal contact 292 is shown to be deposited on the type 2 doping layer 284. In addition, a dielectric layer 288 (e.g., a SiO$_2$ material) is shown to be located in the three areas on top of the silicon wafer 286.

For this disclosed diode structure 280, the first metal contact 290 and the second metal contact 292 are both covered with a dielectric film 288 before the diode 280 is sintered so that the metal contacts 290, 290 are isolated from oxygen in the environment. The dielectric layer 288 is partially removed at the end of the process to expose the metal contacts 290, 292.

It should be noted that in one or more embodiments, the type 1 doping layer 282 is an n-type material (e.g., phosphorous (P)), the silicon wafer 286 is a p-type material, and type 2 doping layer 284 is a p-type material (e.g., boron (B)). In other embodiments, the type 1 doping layer 282 is a p-type material (e.g., boron (B)), the silicon wafer 286 is an n-type material, and type 2 doping layer 284 is an n-type material (e.g., phosphorous (P)).

Figure 3A:
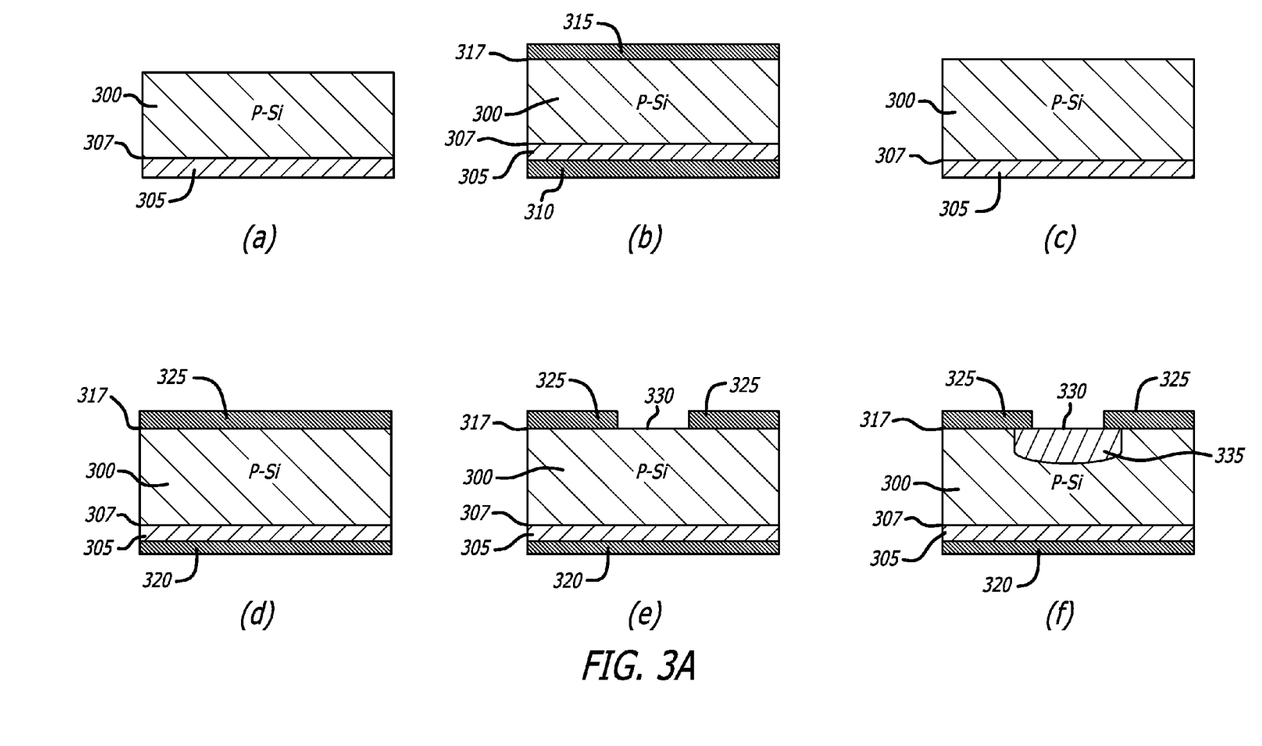
FIGS. 3A and 3B depict the steps of the disclosed method for fabrication of the diode with improved metal contacts of FIG. 2B, in accordance with at least one embodiment of the present disclosure.
Figure 3B:
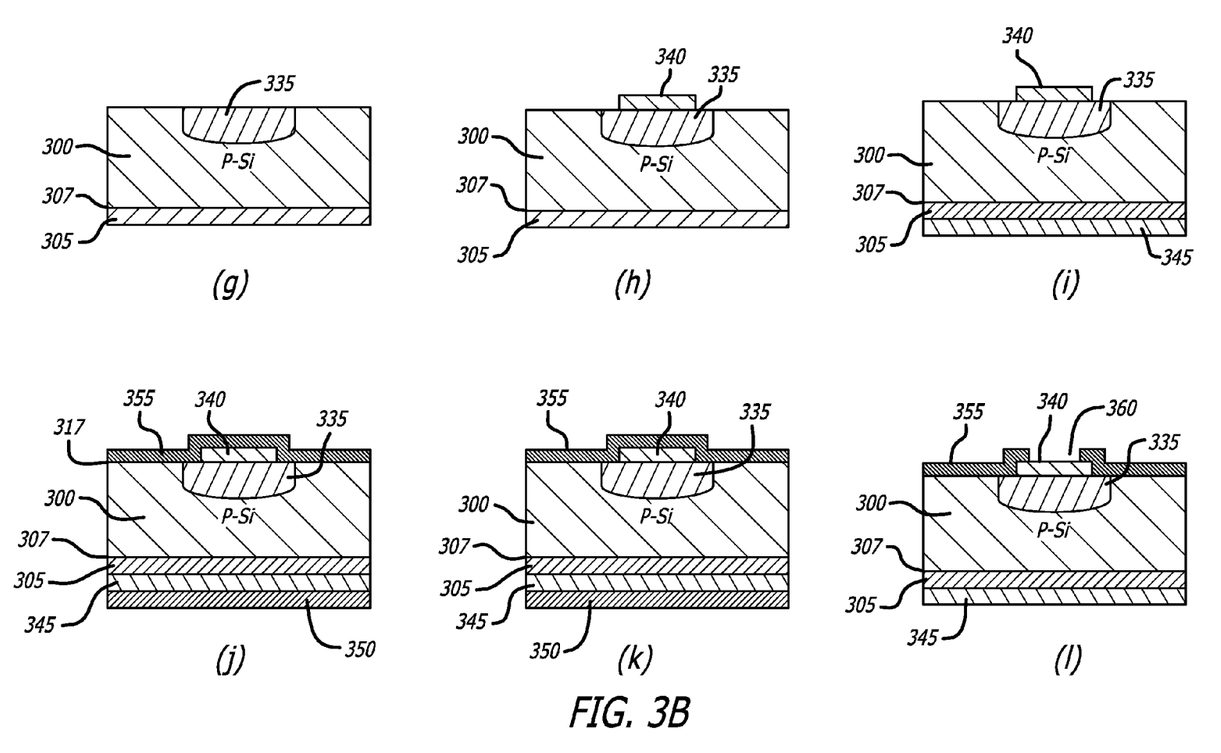

FIGS. 3A and 3B depict the steps of the disclosed method for fabrication of the diode with improved metal contacts of FIG. 2B, in accordance with at least one embodiment of the present disclosure. In these figures, in particular, the steps for the method for manufacturing the diode of FIG. 2 from a p-type silicon wafer are depicted. It should be noted that, in other embodiments, with this method the diode may be manufactured from an n-type silicon wafer as well.

Turning to FIG. 3A, step (a) depicts a heavy p-type first doping layer 305 being formed (i.e. implanted or diffused) on a first side (i.e. the backside) 307 of the p-type silicon wafer 300 by, for example, a Boron implant or a diffusion process. Step (b) illustrates an optional initial SiO$_2$ layer (i.e. a dielectric layer) 310, 315 being deposited by chemical vapor deposition (CVD) on the first doping layer 305 and on the second side 317 of the silicon wafer 300; and thermal annealing performed afterward for alleviating crystal damage from the implantation process. It should be noted that step (b) does not need to be performed if the heavy p-type doping of the first doping layer 305 in step (a) is formed by a diffusion process, rather than by an implantation process.

Step (c) shows that the initial SiO$_2$ layer 310, 315 is removed (i.e. etched off) by soaking the silicon wafer 300 in hydrofluoric acid. Step (d) illustrates a first SiO$_2$ layer (i.e. a dielectric layer) 320, 325 being deposited by chemical vapor deposition (CVD) on the first doping layer 305 and on the second side 317 of the silicon wafer 300, where the SiO$_2$ layer (i.e. dielectric layer) 320, 325 is to be a diffusion mask. Step (e) shows that through photolithography and/or hydrofluoric acid etching, an opening 330 is formed in the first SiO$_2$ layer 325 (i.e. the first SiO$_2$ layer 325 is patterned to have an opening 330) to be a diffusion window. Step (f) depicts a p-n junction 335 created by phosphor diffusion that is performed in a furnace (not shown).

Turning to FIG. 3B, step (g) shows that the first SiO$_2$ layer 320, 325 is removed (i.e. etched off) by soaking the silicon wafer 300 in hydrofluoric acid. Step (h) illustrates a first metal contact (i.e. a front metal contact) 340 (e.g., an n-contact metal, such as a Ti/Pd/Ag alloy) being deposited by electron-beam (e-beam) evaporation. Step (i) shows a second metal contact (i.e. a back metal contact) 345 (e.g., a p-contact metal, such as a Ti/Pd/Ag alloy) being deposited by electron-beam (e-beam) evaporation.

Step (j) depicts a second SiO$_2$ layer (i.e. a dielectric layer) 350, 355 being deposited by chemical vapor deposition (CVD) on the first metal contact 340, on an exposed portion of the second side 317 of the silicon wafer 300, and on the second metal contact 345. It should be noted that the second SiO$_2$ layer 350, 355 may be manufactured from other materials other than $SiO_2$, such as silicon nitride ($Si_3N_4$). In addition, in other embodiments, other techniques other than CVD may be employed to deposit the second $SiO_2$ layer 350, 355. Other techniques that may be used include, but are not limited to, low pressure chemical vapor deposition (LPCVD) and plasma enhanced chemical vapor deposition (PECVD).

Step (k) shows that, optionally, the first metal contact 340 and the second metal contact 345 are sintered. It should be noted that sintering is not needed if the CVD process in step (j) is performed for a similar time duration and similar temperature as is required for ohmic contact sintering. Step (I) shows that through hydrofluoric acid etching, an opening 360 is formed in the second $SiO_2$ layer 355. Step (I) also shows the second $SiO_2$ layer 350 is removed (i.e. etched off) by hydrofluoric acid. The remaining portion of the second $SiO_2$ layer 355 is left to passivate the p-n junction 335 and to prevent a short circuit in the diode and solar cell assembly.

Figure 4:
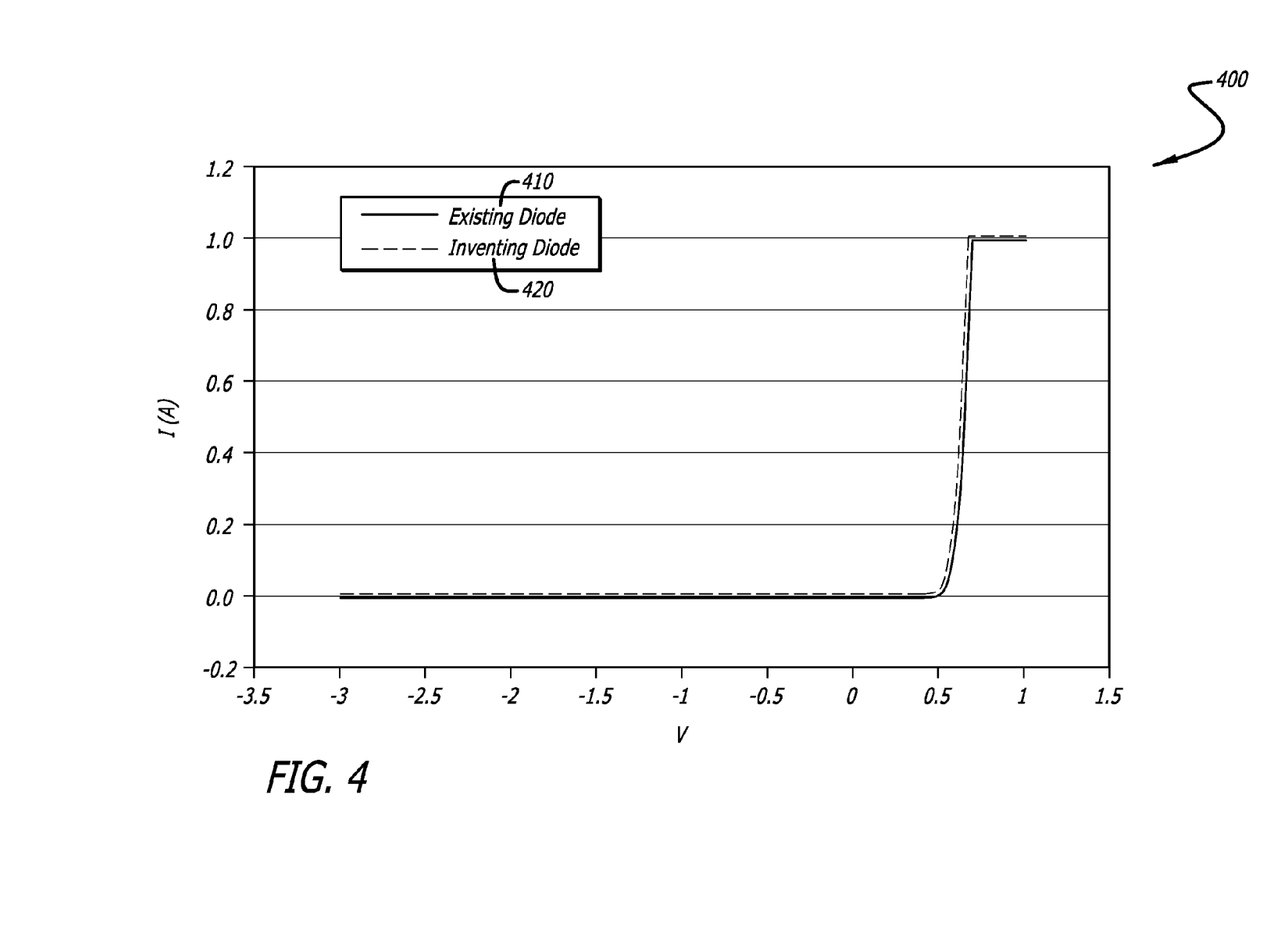
FIG. 4 is a graph showing the current-voltage (I-V) curve of the disclosed diode with improved metal contacts of FIG. 2B verses (vs.) an existing diode.

FIG. 4 is a graph 400 showing the current-voltage (I-V) curve of the disclosed diode of FIG. 2B with improved metal contacts verses (vs.) an existing diode. In this figure, test data is graphed to show a comparison of the I-V curve 420 for the disclosed diode with improved metal contacts verses the I-V curve 410 for an existing diode without $SiO_2$ protection (i.e. without a protective dielectric layer). As is depicted in the figure, the I-V characteristics of the disclosed diode with improved metal contacts are equivalent to the I-V characteristics for an existing diode without $SiO_2$ protection.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for manufacturing a solar cell by-pass diode, the method comprising:
    forming a first doping layer on a first side of a silicon wafer;
    depositing a first dielectric layer on the first doping layer and on a second side of the silicon wafer;
    etching an opening in the first dielectric layer on the second side of the silicon wafer;
    performing one of diffusion and ion implant over the opening to create a junction;
    removing the first dielectric layer from the first doping layer and from the second side of the silicon wafer;
    depositing a first metal contact on the junction, and depositing a second metal contact on the first doping layer;
    depositing a second dielectric layer on the first metal contact, on an exposed portion of the second side of the silicon wafer, and on the second metal contact; and
    etching an opening in the second dielectric layer on the first metal contact; and
    removing the second dielectric layer on the second metal contact.

2. The method of claim 1, wherein the method further comprises, after forming the first doping layer on the first side of a silicon wafer, depositing an initial dielectric layer on the first doping layer and on the second side of the silicon wafer.

3. The method of claim 2, wherein the method further comprises performing thermal annealing.

4. The method of claim 3, wherein the method further comprises removing the initial dielectric layer from the first doping layer and from the second side of the silicon wafer.

5. The method of claim 4, wherein the removing of the initial dielectric layer from the first doping layer and from the second side of the silicon wafer is performed by using hydrofluoric acid.

6. The method of claim 1, wherein the method further comprises, prior to etching the opening in the second dielectric layer on the first metal contact, sintering the first metal contact and the second metal contact.

7. The method of claim 1, wherein the first doping layer is a p-type material.

8. The method of claim 7, wherein the p-type material of the first doping layer is boron (B).

9. The method of claim 1, wherein the first metal contact is one of a titanium, palladium, and silver (Ti/Pd/Ag) alloy; and an aluminum, titanium, palladium, and silver (Al/Ti/Pd/Ag) alloy.

10. The method of claim 1, wherein the second metal contact is one of a titanium, palladium, and silver (Ti/Pd/Ag) alloy; and an aluminum, titanium, palladium, and silver (Al/Ti/Pd/Ag) alloy.

11. The method of claim 1, wherein the first doping layer is an n-type material.

12. The method of claim 11, wherein the n-type material of the first doping layer is phosphorous (P).

13. The method of claim 1, wherein at least one of the first dielectric layer and the second dielectric layer is silicon dioxide ($SiO_2$).

14. The method of claim 1, wherein the etching of the opening in the first dielectric layer on the second side of the silicon wafer is performed by using at least one of photolithography and hydrofluoric acid.

15. The method of claim 1, wherein the removing of the first dielectric layer from the first doping layer and from the second side of the silicon wafer is performed by using hydrofluoric acid.

16. The method of claim 1, wherein the depositing of the first metal contact on the junction and the depositing of the second metal contact on the first doping layer are performed by using electron-beam evaporation.

* * * * *